US012700439B2

(12) United States Patent
D'alessandro et al.

(10) Patent No.: US 12,700,439 B2
(45) Date of Patent: Aug. 4, 2026

(54) ADJUSTABLE DELAY PROPAGATION OF A CONTROL SIGNAL TO DIFFERENT PAGE BUFFER DRIVER GROUPS

(71) Applicant: Micron Technology, Inc., Boise, ID (US)

(72) Inventors: Andrea D'alessandro, Avezzano (IT); Violante Moschiano, Avezzano (IT); Giacomo Donati, Francavilla al Mare (IT); Luigi Marchese, Albignasego (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/786,234

(22) Filed: Jul. 26, 2024

(65) Prior Publication Data

US 2024/0386929 A1      Nov. 21, 2024

Related U.S. Application Data

(62) Division of application No. 17/654,108, filed on Mar. 9, 2022, now Pat. No. 12,051,484.

(60) Provisional application No. 63/221,247, filed on Jul. 13, 2021.

(51) Int. Cl.
| | |
|---|---|
| *G11C 16/26* | (2006.01) |
| *G11C 7/06* | (2006.01) |
| *G11C 7/22* | (2006.01) |
| *G11C 16/32* | (2006.01) |

(52) U.S. Cl.
CPC .............. *G11C 7/225* (2013.01); *G11C 7/06* (2013.01); *G11C 7/227* (2013.01); *G11C 16/32* (2013.01); *G11C 16/26* (2013.01)

(58) Field of Classification Search
CPC ..................................................... G11C 16/26
See application file for complete search history.

(56) References Cited

U.S. PATENT DOCUMENTS

| | | | |
|---|---|---|---|
| 5,144,525 | A | 9/1992 | Saxe et al. |
| 5,422,856 | A | 6/1995 | Sasaki et al. |
| 5,521,599 | A | 5/1996 | McCarroll et al. |
| 5,544,342 | A | 8/1996 | Dean |
| 7,164,601 | B2 | 1/2007 | Mitani et al. |
| 7,257,047 | B2 | 8/2007 | Kim |
| 7,719,897 | B2 | 5/2010 | Lee et al. |
| 8,085,574 | B2 | 12/2011 | Kang |
| 9,305,660 | B2 | 4/2016 | Moschiano et al. |
| 10,347,344 | B2 | 7/2019 | Malshe et al. |
| 10,607,693 | B2 | 3/2020 | Cariello et al. |
| 10,621,091 | B2 | 4/2020 | Mondello et al. |
| 10,658,041 | B1 | 5/2020 | Pilolli et al. |

(Continued)

*Primary Examiner* — Jason Lappas
(74) *Attorney, Agent, or Firm* — TraskBritt

(57) ABSTRACT

A microelectronic device comprises a microelectronic device structure comprising a section comprising page buffers, and an additional section horizontally neighboring the section and comprising page buffer drivers and a timing delay chain coupled to the page buffer drivers. Each of the page buffer drivers is coupled to a different group of the page buffers than each other of the page buffer drivers. The timing delay chain comprises timing delay circuits coupled in series with one another. Each of the timing delay circuits is configured to adjustably delay propagation of a control signal therethrough. Memory devices, methods of operating memory devices, and electronic systems are also described.

20 Claims, 7 Drawing Sheets

(56)  References Cited

U.S. PATENT DOCUMENTS

| | | | |
|---|---|---|---|
| 10,748,624 B2 | 8/2020 | Bonitz | |
| 10,872,674 B1 | 12/2020 | Tripathi et al. | |
| 10,884,638 B1 | 1/2021 | Cariello et al. | |
| 10,916,315 B2 | 2/2021 | Yu et al. | |
| 2006/0104125 A1* | 5/2006 | Kim ....................... | G11C 16/26 |
| | | | 365/189.05 |
| 2007/0002624 A1 | 1/2007 | Ju | |
| 2007/0257714 A1 | 11/2007 | Cheung | |
| 2014/0153329 A1 | 6/2014 | Kang et al. | |
| 2020/0356311 A1 | 11/2020 | Hsu et al. | |
| 2021/0057020 A1 | 2/2021 | Tanaka | |
| 2021/0082527 A1 | 3/2021 | Piccardi | |

* cited by examiner

ADJUSTABLE DELAY PROPAGATION OF A CONTROL SIGNAL TO DIFFERENT PAGE BUFFER DRIVER GROUPS

CROSS-REFERENCE TO RELATED APPLICATIONS

This application is a divisional of U.S. patent application Ser. No. 17/654,108, filed Mar. 9, 2022, now U.S. Pat. No. 12,051,484, issued Jul. 30, 2024, which claims the benefit under 35 U.S.C. § 119(e) of U.S. Provisional Patent Application Ser. No. 63/221,247, filed Jul. 13, 2021, the disclosure of each of which is hereby incorporated herein in its entirety by this reference.

TECHNICAL FIELD

Embodiments of the disclosure relate to the field of microelectronic device design and fabrication. More specifically, embodiments of the disclosure relate to microelectronic devices including page buffer circuitry, and to related memory devices, methods of operating memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize three-dimensional (3D) memory array architectures. A conventional 3D memory array of a non-volatile memory device includes strings of memory cells vertically extending through stack structure including conductive structures vertically interleaved with insulative material, wherein the conductive structures serve as local access lines (e.g., local word lines) for the memory array. Such a configuration permits a greater number of switching devices (e.g., transistors) to be located in a unit of die area (i.e., length and width of active surface consumed) by building the memory array upwards (e.g., vertically) on a die, as compared to structures with conventional planar (e.g., two-dimensional) arrangements of switching devices.

Various operations for non-volatile memory devices (e.g., 3D NAND Flash memory devices) draw current and consume corresponding amounts of power. For example, page buffer operations for a conventional non-volatile memory device may draw significant amounts of current from a power source. Page buffer operations may include temporarily storing data read from memory cells of a selected page of memory cells before the data is output to input/output (I/O) circuitry; and receiving and temporarily storing data from I/O circuitry before the data is output to memory cells of a selected page of memory cells. Such page buffer operations are generally effectuated by underlying firmware that executes the page buffer operations during operation of the non-volatile memory device. Power consumption associated with page buffer operations is an important consideration in the design and operation of non-volatile memory devices. Power consumption problems can arise when large quantities of page buffer circuits are operated concurrently. Such problems can include peak power consumption that exceeds power consumption specifications and/or power availability.

DETAILED DESCRIPTION

Figure 1A:
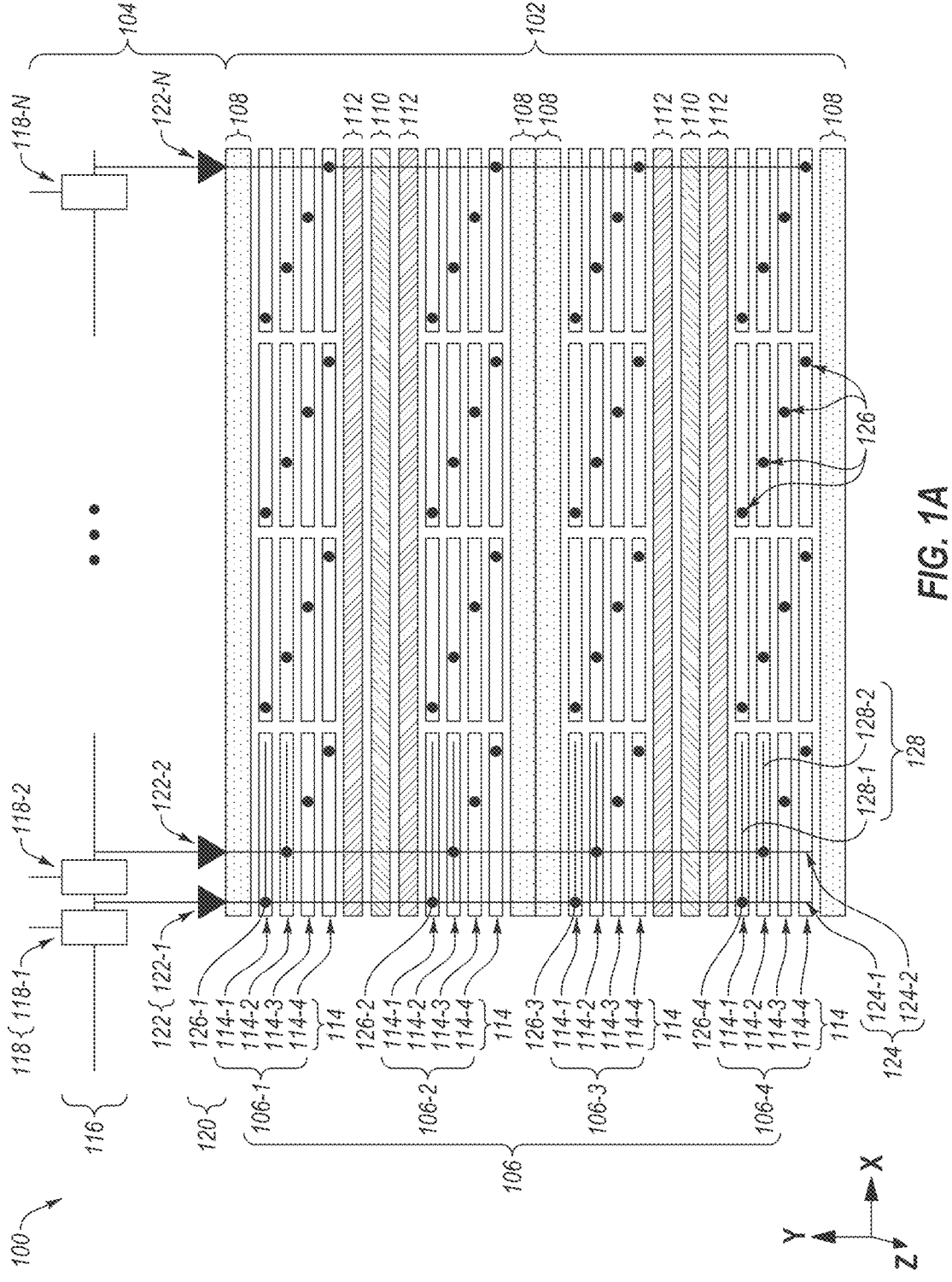
FIG. 1A is simplified, partial plan view of a microelectronic device structure of a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional non-volatile memory, such as conventional NAND memory; conventional volatile memory, such as conventional dynamic random access memory (DRAM)), but also includes an application specific integrated circuit (ASIC) (e.g., a system on a chip (SoC)), a microelectronic device combining logic and memory, and a graphics processing unit (GPU) incorporating memory.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/of" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "configured" refers to a size, shape, material composition, orientation, and arrangement of one or more of at least one structure and at least one apparatus facilitating operation of one or more of the structure and the apparatus in a pre-determined way.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_zO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound"

means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

FIG. 1A is a simplified, partial plan view of a microelectronic device structure 100 for a microelectronic device (e.g., a semiconductor device; a memory device, such as a 3D NAND Flash memory device), in accordance with embodiments of the disclosure. As shown in FIG. 1A, the microelectronic device structure 100 includes at least one plane section 102 (also referred to herein as at least one "buffer section"), and at least one timing delay and page buffer driver section 104 horizontally neighboring (e.g., in the Y-direction) and operatively associated with the plane section 102. As described in further detail below, the plane section 102 and the timing delay and page buffer driver section 104 of the microelectronic device structure 100 include various features (e.g., structures, devices) within horizontal areas thereof that may be employed to control operation of additional features (e.g., additional structures, additional devices) of the microelectronic device structure 100. The microelectronic device structure 100 (including the plane section 102 and the timing delay and page buffer driver section 104 thereof) may, for example, be included as a portion of a base structure (e.g., a semiconductor base structure) of a microelectronic device, as also described in further detail below.

A configuration of an individual plane section 102 of the microelectronic device structure 100 may at least partially depend on a quantity and arrangement of memory cells within a microelectronic device (e.g., a memory device, such as a NAND Flash memory device) including the microelectronic device structure 100. A microelectronic device may include a quantity of memory cells within in one or more groups, such as one or more of at least one page of memory cells, at least one block of memory cells, at least one plane of memory cells, at least one die of memory cells, an entire array of memory cells, and/or at least one other group of memory cells. Some memory arrays may, for example, include a quantity of pages of memory cells that form a block of memory cells. In turn, a quantity of such blocks may be included in a plane of memory cells, and quantity of such planes of memory cells may be included in a die. By way of non-limiting example, a 128 gigabyte (GB) memory device may include 4320 bytes (B) of data per page, 128 pages per block, 2048 blocks per plane, and 16 planes per device. As another non-limiting example, a 48 gigabyte (GB) triple-level cell (TLC) NAND memory device may include 8,592 B of data per page (16,384+2208 B), 1536 pages per block, 548 blocks per plane, and four (4) or more planes per device. As an additional non-limiting example, a 32 GB multi-level cell (MLC) memory device (storing two (2) bits of data per cell (four (4) programmable states)) may include 18,592 B of data per page (16,384+2208 bytes), 1024 pages per block, 548 blocks per plane, and 4 planes per device. A configuration of the plane section 102 (e.g., including a horizontal shape and horizontal dimensions thereof) of the microelectronic device structure 100 may be based, at least in part, on a quantity and arrangement of memory cells grouped within one plane of a microelectronic device including the microelectronic device structure 100.

The plane section 102 of the microelectronic device structure 100 includes, without limitation, sense amplifier regions 106 (also referred to herein as "sense blocks" and "sense regions"), data line exit regions 108, input/output (I/O) regions 110, and data cache regions 112 (e.g., secondary data cache (SDC) regions). As depicted in FIG. 1A, for each of the sense amplifier regions 106, one of the data line exit regions 108 may horizontally neighbor (e.g., in the Y-direction) a first horizontal boundary (e.g., in the Y-direction) of the sense amplifier region 106, and one of the data cache regions 112 may horizontally neighbor (e.g., in the Y-direction) a second horizontal boundary (e.g., in the Y-direction) of the sense amplifier region 106 opposing the first horizontal boundary of the sense amplifier region 106. In some embodiments, two (2) of the data line exit regions 108 are positioned directly horizontally adjacent (e.g., in the Y-direction) one another within the plane section 102, and are together horizontally interposed (e.g., in the Y-direction) between two (2) of the sense amplifier regions 106 horizontally neighboring (e.g., in the Y-direction) one another. In addition, the I/O regions 110 may each individually be horizontally interposed (e.g., in the Y-direction) between two (2) of the data cache regions 112.

In some embodiments, the plane section 102 of the microelectronic device structure 100 includes four (4) of the sense amplifier regions 106. For example, as shown in FIG. 1A, the sense amplifier regions 106 may include a first sense amplifier region 106-1, a second sense amplifier region 106-2, a third sense amplifier region 106-3, and a fourth sense amplifier region 106-4. In additional embodiments, the plane section 102 may be formed to include a different quantity of the sense amplifier regions 106, such as less than four (4) of the sense amplifier regions 106 (e.g., two (2) of the sense amplifier regions 106), or greater than four (4) of the sense amplifier regions 106 (e.g., six (6) of the sense amplifier regions 106, eight (8) of the sense amplifier regions 106, sixteen (16) of the sense amplifier regions 106). Each of the sense amplifier regions 106 may exhibit substantially the same horizontal area as each other of the sense amplifier regions 106, or at least one of the sense amplifier regions 106 may exhibit a different horizontal area than at least one other of the sense amplifier regions 106.

Still referring to FIG. 1A, each sense amplifier region 106 within the plane section 102 of the microelectronic device structure 100 may be sub-divided into multiple (e.g., a plurality of) sense amplifier sub-regions 114 (also referred to herein as "sense sub-blocks" and "sense sub-regions"). Each sense amplifier sub-region 114 may include a pre-determined quantity of sense amplifiers within a horizontal area thereof. The sense amplifiers may be configured to sense data values indicated on data lines operatively associated with the data line exit regions 108 of the plane section 102. Each of the sense amplifier sub-regions 114 may have substantially the same horizontal area as each other of the sense amplifier sub-regions 114, or at least one of the sense amplifier sub-regions 114 may have a different horizontal area than at least one other of the sense amplifier sub-regions 114. In some embodiments, each of the sense amplifier sub-regions 114 has substantially the same horizontal area as each other of the sense amplifier sub-regions 114.

Each of the sense amplifier regions 106 may include columns of the sense amplifier sub-regions 114 extending in a first horizontal direction (e.g., the Y-direction) and rows of the sense amplifier sub-regions 114 extending in a second horizontal direction (e.g., the X-direction) orthogonal to the first horizontal direction. As depicted in FIG. 1A, in some embodiments, each sense amplifier region 106 includes four (4) columns of sense amplifier sub-regions 114 each individually extending in the Y-direction, and four (4) rows of the sense amplifier sub-regions 114 each individually extending in the X-direction orthogonal to the Y-direction. In further embodiments, one or more (e.g., each) of the sense amplifier regions 106 includes a different quantity of columns of sense amplifier sub-regions 114 (e.g., less than four (4) columns, such as two (2) columns, or one (1) column; greater than four (4) columns, such as six (6) columns, eight (8) columns, sixteen (16) columns, or thirty-two (32) columns), and/or a different quantity of rows of sense amplifier sub-regions 114 (e.g., less than four (4) rows, such as two (2) rows, or one (1) row; greater than four (4) rows, such as six (6) rows, eight (8) rows, sixteen (16) rows, or thirty-two (32) rows).

Each column of sense amplifier sub-regions 114 within an individual sense amplifier region 106 may include a desired quantity of sense amplifier sub-regions 114. In some embodiments, within an individual sense amplifier region 106, each column of the sense amplifier sub-regions 114 includes four (4) sense amplifier sub-regions 114. For example, as shown in FIG. 1A, within an individual sense amplifier region 106, each column of sense amplifier sub-regions 114 may include a first sense amplifier sub-region 114-1, a second sense amplifier sub-region 114-2, a third sense amplifier sub-region 114-3, and a fourth sense amplifier sub-region 114-4. In additional embodiments, one or more column(s) of the sense amplifier sub-regions 114 within an individual sense amplifier region 106 may individually include a different quantity of sense amplifier sub-regions 114, such as less than four (4) of the sense amplifier sub-regions 114 (e.g., two (2) sense amplifier sub-regions 114, one (1) sense amplifier sub-region 114), or greater than four (4) of the sense amplifier sub-regions 114 (e.g., six (6) sense amplifier sub-regions 114, eight (8) sense amplifier sub-regions 114, sixteen (16) sense amplifier sub-regions 114). Within an individual sense amplifier region 106, each column of the sense amplifier sub-regions 114 may include substantially the same quantity of sense amplifier sub-regions 114 as each other column of the sense amplifier sub-regions 114, or at least one column of the sense amplifier sub-regions 114 may include a different quantity of sense amplifier sub-regions 114 than at least one other column of the sense amplifier sub-regions 114.

In addition, each row of sense amplifier sub-regions 114 within an individual sense amplifier region 106 may include a desired quantity of sense amplifier sub-regions 114. In some embodiments, within an individual sense amplifier region 106, each row of the sense amplifier sub-regions 114 includes four (4) sense amplifier sub-regions 114. For example, within an individual sense amplifier region 106, a first row of the sense amplifier sub-regions 114 may include four (4) first sense amplifier sub-regions 114-1, a second row of the sense amplifier sub-regions 114 may include four (4) second sense amplifier sub-regions 114-2, a third row of the sense amplifier sub-regions 114 may include four (4) third sense amplifier sub-regions 114-3, and a fourth row of the sense amplifier sub-regions 114 may include four (4) fourth sense amplifier sub-regions 114-4. In additional embodiments, one or more row(s) of the sense amplifier sub-regions 114 within an individual sense amplifier region 106 may individually include a different quantity of sense amplifier sub-regions 114, such as less than four (4) of the sense amplifier sub-regions 114 (e.g., two (2) sense amplifier sub-regions 114, one (1) sense amplifier sub-region 114), or greater than four (4) of the sense amplifier sub-regions 114 (e.g., six (6) sense amplifier sub-regions 114, eight (8) sense amplifier sub-regions 114, sixteen (16) sense amplifier sub-regions 114). Within an individual sense amplifier region 106, each row of the sense amplifier sub-regions 114 may include substantially the same quantity of sense amplifier sub-regions 114 as each other row of the sense amplifier sub-regions 114, or at least one row of the sense amplifier sub-regions 114 may include a different quantity of sense amplifier sub-regions 114 than at least one other row of the sense amplifier sub-regions 114.

As previously discussed, each sense amplifier sub-region 114 within the plane section 102 of the microelectronic device structure 100 may individually include a desired quantity of sense amplifiers. In some embodiments, each sense amplifier sub-region 114 individually includes a quantity of sense amplifiers permitting the plane section 102 as a whole to include approximately 150,000 of the sense amplifiers. For example, if the plane section 102 includes sixty-four (64) sense amplifier sub-regions 114 (e.g., within four (4) sense amplifier regions 106 each including sixteen (16) of the sense amplifier sub-regions 114), each of the sense amplifier sub-regions 114 thereof may include from about 2300 of the sense amplifiers to about 2400 of the sense amplifiers (e.g., from about 2325 of the sense amplifiers to about 2350 of the sense amplifiers). In additional embodiments, each sense amplifier sub-region 114 individually includes a quantity of sense amplifiers permitting the plane section 102 as a whole to include less than about 150,000 of the sense amplifiers (e.g., less than or equal to about 75,000 of the sense amplifiers, less than or equal to about 37,500 of the sense amplifiers), or greater than about 150,000 of the sense amplifiers (e.g., greater than or equal to about 300,000 of the sense amplifiers, greater than or equal to about 600,000 of the sense amplifiers). Each of the sense amplifier sub-regions 114 may have substantially the same quantity of sense amplifiers as each other of the sense amplifier sub-regions 114, or at least one of the sense amplifier sub-regions 114 may have a different quantity of sense amplifiers than at least one other of the sense amplifier sub-regions 114. In some embodiments, each of the sense amplifier sub-regions 114 of the plane section 102 has substantially the same quantity of sense amplifiers as each other of the sense amplifier sub-regions 114 of the plane section 102.

Still referring to FIG. 1A, the data line exit regions 108 of the plane section 102 may individually include, without limitation, circuitry (e.g., multiplexers (MUX); isolation transistors, such as high-voltage-isolation (HVISO) transistors and/or low-voltage-isolation (LVISO) transistors) coupled to and interposed between page buffer circuitry within other regions (e.g., the sense amplifier regions 106, the data cache regions 112) of the plane section 102 and data lines (e.g., digit lines, bit lines) vertically offset (e.g., in the Z-direction) from the microelectronic device structure 100. The data lines may, for example, vertically overlie (e.g., in the Z-direction) the microelectronic device structure 100, and may be coupled to strings of memory cells of one or more memory array(s) vertically overlying (e.g., in the Z-direction) the microelectronic device structure 100. Such a configuration of data lines is described in further detail below with reference to FIG. 4.

The I/O regions 110 of the plane section 102 may individually include, without limitation, I/O circuitry coupled to and interposed between page buffer circuitry within other regions (e.g., the sense amplifier regions 106, the data cache regions 112) of the plane section 102 and an address register of a microelectronic device including the microelectronic device structure 100. The address register may be in electrical communication with column decode circuitry and row decode circuitry to latch address signals prior to decoding. The I/O circuitry of the I/O regions 110 may be configured to manage input of commands, addresses, and data to the memory array(s) of the microelectronic device including the microelectronic device structure 100, as well as output of data and status information from the memory array(s). The I/O circuitry of the I/O regions 110 may also be in electrical communication with a command (CMD) register in electrical communication with various control logic circuitry of the microelectronic device including the microelectronic device structure 100.

The data cache regions 112 of the plane section 102 may individually include, without limitation, data storage circuitry (e.g., data latch devices) coupled to and interposed between I/O circuitry within the I/O regions 110 and sense circuitry (e.g., sense amplifiers) within the sense amplifier regions 106. In some embodiments, the data storage circuitry of the data cache regions 112 includes data latches. Each data latch within an individual data cache region 112 may individually be coupled to I/O circuitry within one of the I/O regions 110 horizontally neighboring (e.g., in the Y-direction) a first horizontal boundary of the data cache region 112 and to a sense amplifier within one of the sense amplifier regions 106 horizontally neighboring (e.g., in the Y-direction) a second horizontal boundary of the data cache region 112 opposing the first horizontal boundary.

Sense circuitry of the sense amplifier regions 106 and data storage circuitry of the data cache regions 112 may together (e.g., in combination) form page buffer circuitry of the plane section 102. An individual page buffer circuit (also referred to herein as a "page buffer") may, for example, include a sense amplifier within one of the sense amplifier sub-regions 114 of one of the sense amplifier regions 106, as well as a data latch within one of the data cache regions 112 horizontally neighboring (e.g., in the Y-direction) the one of the sense amplifier regions 106. The sense amplifier of the page buffer circuit may be configured to sense information (e.g., in the form of a signal) on a data line of a microelectronic device including the microelectronic device structure 100, and the data latch of the page buffer circuit may be configured to store (e.g., temporarily store) one or more bit(s) of information carried by the data line. The page buffer circuitry of the plane section 102 of the microelectronic device structure 100 may be driven by multiple (e.g., a plurality of)

page buffer drivers within the timing delay and page buffer driver section 104 of the microelectronic device structure 100, as described in further detail below.

With continued reference to FIG. 1A, the timing delay and page buffer driver section 104 of the microelectronic device structure 100 includes a timing delay region 116 including a timing delay chain (also referred to herein as a "timing delay relay") having a series of timing delay stages 118; and a page buffer driver region 120 including page buffer drivers 122 in electrical communication with the timing delay stages 118 of the timing delay region 116. As described in further detail below, the timing delay and page buffer driver section 104 may be configured and operated to stagger control and operation of different groups of page buffers within the plane section 102 in time to facilitate a reduction in peak power requirements associated with page buffer macro execution relative to conventional configurations.

The page buffer driver region 120 of the timing delay and page buffer driver section 104 includes multiple (e.g., a plurality of) page buffer drivers 122 distributed across a horizontal dimension (e.g., a width in the X-direction) of the plane section 102. For example, as depicted in FIG. 1A, the page buffer driver region 120 may include a first page buffer driver 122-1, a second page buffer driver 122-2, and so on, up to a predetermined final page buffer driver 122-N. A quantity of page buffer drivers 122 included in the page buffer driver region 120 may correspond to (e.g., equal) a quantity of sense amplifier sub-regions 114 included within an individual sense amplifier region 106 of the plane section 102 of the microelectronic device structure 100. As a non-limiting example, if an individual sense amplifier region 106 (e.g., the first sense amplifier region 106-1) of the plane section 102 includes sixteen (16) sense amplifier sub-regions 114, the page buffer driver region 120 may include sixteen (16) page buffer drivers 122 operably associated with the sixteen (16) sense amplifier sub-regions 114 of the individual sense amplifier region 106. As another non-limiting example, if an individual sense amplifier region 106 (e.g., the first sense amplifier region 106-1) of the plane section 102 includes thirty-two (32) sense amplifier sub-regions 114, the page buffer driver region 120 may include thirty-two (32) page buffer drivers 122 operably associated with the thirty-two (32) sense amplifier sub-regions 114 of the individual sense amplifier region 106.

Still referring to FIG. 1A, the page buffer drivers 122 within the page buffer driver region 120 may be coupled to conductive lines 124 individually horizontally extending (e.g., in the Y-direction) through the plane section 102 of the microelectronic device structure 100. The conductive lines 124 may continuously horizontally extend in parallel across the plane section 102, through each of the sense amplifier regions 106 (e.g., each of the first sense amplifier region 106-1, the second sense amplifier region 106-2, the third sense amplifier region 106-3, and the fourth sense amplifier region 106-4) thereof. As used herein, the term "parallel" means substantially parallel. Each of the conductive lines 124 may individually be coupled to one of the page buffer drivers 122, such that a quantity of the conductive lines 124 corresponds to (e.g., equals) a quantity of the page buffer drivers 122. For example, as shown in FIG. 1A, the microelectronic device structure 100 may include a first conductive line 124-1 coupled to the first page buffer driver 122-1, a second conductive line 124-2 coupled to the second page buffer driver 122-2, and so on, up to a final conductive line 124-N coupled to the final page buffer driver 122-N. If the microelectronic device structure 100 includes sixteen (16) of the page buffer drivers 122 (e.g., the value of "N" for the final page buffer driver 122-N is 16), the microelectronic device structure 100 may also include sixteen (16) of the conductive lines 124 (e.g., the value of "N" for the conductive line 124-N is also sixteen (16)) coupled to the sixteen (16) of the page buffer drivers 122.

Each of the conductive lines 124 may individually be coupled to the sense amplifiers of sense amplifier sub-regions 114 located within different sense amplifier regions 106 of the plane section 102 than one another. As a non-limiting example, if the plane section 102 includes four (4) sense amplifier regions 106, each of the conductive lines 124 may individually be coupled to the sense amplifiers within four (4) different sense amplifier sub-regions 114 within the plane section 102, wherein the four (4) different sense amplifier sub-regions 114 are all located in different sense amplifier regions 106 of the plane section 102 than one another. As shown in FIG. 1A, different sense amplifier sub-regions 114 operatively associated with an individual conductive line 124 may be substantially aligned within one another in the X-direction, and may be substantially similarly positioned in the Y-direction within their respective sense amplifier regions 106. An individual conductive line 124 may, for example, be operatively associated with different sense amplifier sub-regions 114 similarly positioned relative to one another within horizontally aligned columns of sense amplifier sub-regions 114 within different sense amplifier regions 106 of the plane section 102. As a non-limiting example, the first conductive line 124-1 may be coupled to the sense amplifiers within the first sense amplifier sub-region 114-1 of a first column of the first sense amplifier sub-regions 114 within each of the first sense amplifier region 106-1, the second sense amplifier region 106-2, the third sense amplifier region 106-3, and the fourth sense amplifier region 106-4. As another non-limiting example, the second conductive line 124-2 may be coupled to the sense amplifiers within the second sense amplifier sub-region 114-2 of the first column of the first sense amplifier sub-regions 114 within each of the first sense amplifier region 106-1, the second sense amplifier region 106-2, the third sense amplifier region 106-3, and the fourth sense amplifier region 106-4.

As shown in FIG. 1A, the conductive lines 124 may individually be coupled to the sense amplifiers within different sense amplifier sub-regions 114 of the plane section 102 by way of conductive contacts 126 and additional conductive lines 128. Each additional conductive line 128 may be coupled to the sense amplifiers within an individual sense amplifier sub-region 114 of the plane section 102, and may also be coupled to one of the conductive lines 124 by way of one of the conductive contacts 126.

An individual additional conductive line 128 operatively associated with an individual sense amplifier sub-region 114 may be substantially confined within a horizontal area of the individual sense amplifier sub-region 114. For example, an individual additional conductive line 128 may not horizontally extend in the X-direction across more than one of the sense amplifier sub-regions 114. Each sense amplifier sub-region 114 of each column of sense amplifier sub-regions 114 within an individual sense amplifier region 106 may have an individual additional conductive line 128 operatively associated therewith and substantially confined within a horizontal area thereof. For example, a first additional conductive line 128-1 may be coupled to the sense amplifiers of a first sense amplifier sub-region 114-1 of a first column of sense amplifier sub-regions 114 within the fourth sense amplifier region 106-4, and may also be substantially confined within the horizontal area of the first sense amplifier sub-region 114-1. As another example, a second additional conductive line 128-2 may be coupled to the sense amplifiers of a second sense amplifier sub-region 114-2 of the first column of sense amplifier sub-regions 114 within the fourth sense amplifier region 106-4, and may also be substantially confined within the horizontal area of the second sense amplifier sub-region 114-2.

As shown in FIG. 1A, a quantity of conductive contacts 126 coupled to an individual conductive line 124 may correspond to (e.g., equal) a quantity of sense amplifier sub-regions 114 operatively associated with the conductive line 124. For example, if an individual conductive line 124 is operatively associated with four (4) sense amplifier sub-regions 114 within the plane section 102 (e.g., one sense amplifier sub-region 114 in each of four (4) sense amplifier regions 106), the individual conductive line 124 may have four (4) different conductive contacts 126 coupled thereto, and each of the four (4) different conductive contacts 126 may couple the individual conductive line 124 to a different one of the additional conductive lines 128. By way of non-limiting example, the first conductive line 124-1 may have each of a first conductive contact 126-1, a second conductive contact 126-2, a third conductive contact 126-3, and a fourth conductive contact 126-4 coupled thereto and electrically connecting the first conductive line 124-1 to different additional conductive lines 128 than one another. As depicted in FIG. 1A, each of the conductive contacts 126 coupled to an individual conductive line 124 (e.g., the first conductive line 124-1) may be horizontally offset in the Y-direction from each other of the conductive contacts 126 coupled to each other conductive line 124 (e.g., the second conductive line 124-2) horizontally neighboring the conductive line 124 in the X-direction.

The page buffer drivers 122 within the page buffer driver region 120 may collectively be electrically connected to all of the page buffer circuitry (e.g., all of the page buffers) within the plane section 102 by way of the conductive lines 124, the conductive contacts 126, and the additional conductive lines 128; but may individually be electrically connected to less than all of the page buffer circuitry (e.g., less than all of the page buffers) within the plane section 102. Namely, each page buffer driver 122 may be configured and operated to drive only a portion of an entirety of the page buffer circuitry (e.g., only some of the page buffers) within plane section 102. As a result, each of the page buffer drivers 122 may be relatively smaller than a conventional page buffer driver configured and operated to drive an entirety of page buffer circuitry (e.g., all of the page buffers) within a conventional plane section of a conventional microelectronic device structure. In addition, unlike conventional configurations wherein a single (e.g., only one) page buffer driver drives all of the page buffer circuitry within a conventional plane section at the same time (e.g., synchronously, simultaneously, concurrently), the multiple (e.g., plurality of) page buffer drivers 122 of the page buffer driver region 120, together with the timing delay chain of the timing delay region 116 (described in further detail below), permit different portions of the page buffer circuitry (e.g., different groups of page buffers) within the plane section 102 to be driven at different times (e.g., asynchronously, non-concurrently, sequentially) by different page buffer drivers 122. Driving different portions of the page buffer circuitry within the plane section 102 at different times than one another spreads a supply power demand for driving all of the page buffer circuitry within the plane section 102 across a relatively longer timeframe, facilitating a relatively smaller magnitude of a peak supply power required for page buffer macro execution as compared to conventional configurations.

Still referring to FIG. 1A, circuitry of the timing delay region 116 of the timing delay and page buffer driver section 104 may be configured and operated to receive a control signal for controlling the page buffer circuitry within the plane section 102 and to delay (e.g., adjustably delay, trimmably delay) propagation of the control signal to different page buffer drivers 122 (e.g., the first page buffer driver 122-1, the second page buffer driver 122-2, and so on, to the final page buffer driver 122-N) to asynchronously (e.g., sequentially, non-concurrently) control different portions of the page buffer circuitry operatively associated with the different page buffer drivers 122. For example, as described in further detail below, the timing delay chain of the timing delay region 116 may be configured and operated to stagger transitions in logic levels (e.g., between logic LOW and logic HIGH) of the control signal by way of the series of timing delay stages 118 thereof to delay (e.g., adjustably delay, trimmably delay) the propagation of the control signal to page buffer drivers 122 horizontally positioned (e.g., in the X-direction) progressively farther down the timing delay chain relative to horizontally preceding page buffer drivers 122. By asynchronously (e.g., sequentially, non-concurrently) driving a control signal to different portions of the page buffer circuitry of the plane section 102, supply voltage ($V_{cc}$) drop and ground ($V_{ss}$) bounce associated with operating the page buffer circuitry may be more readily controlled relative to synchronously (e.g., simultaneously, concurrently) driving a control signal to all portions of the page buffer circuitry, so as to better avoid headroom (HR) (e.g., difference between minimum $V_{cc}$ drop and maximum $V_{ss}$ bounce) specification violations.

The timing delay stages 118 of the timing delay region 116 may be coupled to the page buffer drivers 122 of the page buffer driver region 120, and may positionality alternate with the page buffer drivers 122 across a horizontal dimension (e.g., a width in the X-direction) of the plane section 102. A quantity of the timing delay stages 118 within the timing delay region 116 may correspond to a quantity of the page buffer drivers 122 within the page buffer driver region 120. For example, as depicted in FIG. 1A, the timing delay region 116 may include a first timing delay stage 118-1, a second timing delay stage 118-2, and so on, up to a predetermined final timing delay stage 118-N. The value of "N" for the final timing delay stage 118-N may be the same as the value of "N" for the final page buffer driver 122-N. An output terminal of the first timing delay stage 118-1 may be coupled to an input terminal of the first page buffer driver 122-1, an output terminal of the second timing delay stage 118-2 may be coupled to an input terminal of the second page buffer driver 122-2, and so on, up to an output terminal of the final timing delay stage 118-N being coupled to an input terminal of the final page buffer driver 122-N.

Figure 1B:
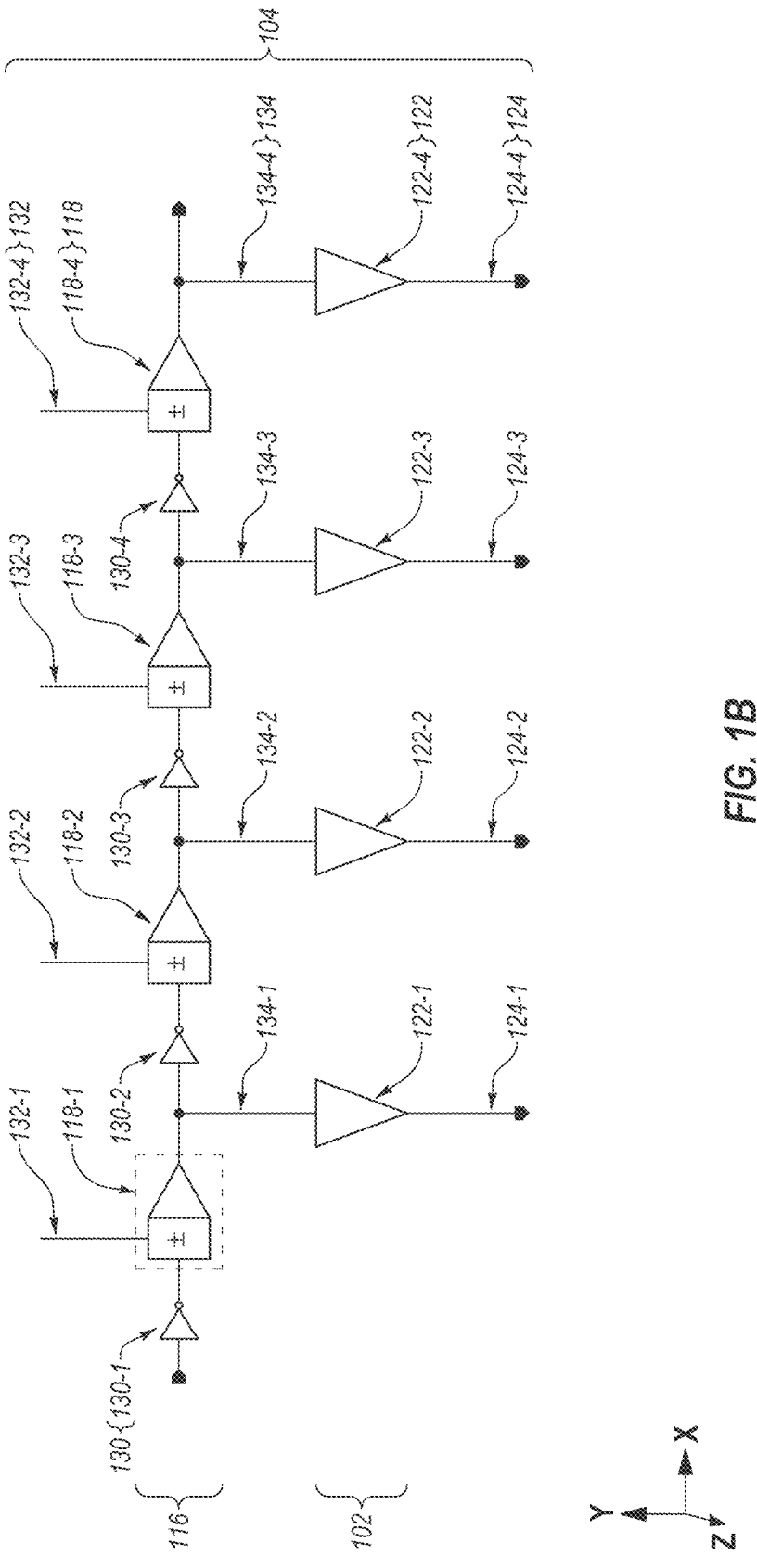
FIG. 1B is a schematic diagram of circuitry of a timing delay and page buffer driver section of the microelectronic device structure shown in FIG. 1A.

FIG. 1B is a schematic diagram of circuitry of the timing delay and page buffer driver section 104 of the microelectronic device structure 100 shown in FIG. 1A, in accordance with embodiments of the disclosure. As shown in FIG. 1B, the circuitry of the timing delay and page buffer driver section 104 includes the timing delay stages 118 and the page buffer drivers 122, as well as inverters 130 operatively associated with the timing delay stages 118 and the page buffer drivers 122. A first inverter 130-1 may be positioned ahead of the first timing delay stage 118-1 within the timing delay chain of the timing delay region 116, and may be configured to receive a control signal (e.g., from a control register ($C_{reg}$)) and to invert a polarity of the control signal. Subsequent inverters 130 (e.g., a second inverter 130-2, a third inverter 130-3, a fourth inverter 130-4) may be positioned between neighboring timing delay stages 118 (e.g., the first timing delay stage 118-1 and the second timing delay stage 118-2, the second timing delay stage 118-2 and a third timing delay stage 118-3, the third timing delay stage 118-3 and a fourth timing delay stage 118-4), and may each be similarly employed to invert the polarity of the control signal received thereby (as output from a preceding timing delay stage 118) to facilitate proper propagation of the control signal through a remainder of the timing delay chain and the page buffer drivers 122 operatively associated therewith. The timing delay and page buffer driver section 104 also includes additional conductive lines 132 (e.g., a first additional conductive line 132-1, a second additional conductive line 132-2, a third additional conductive line 132-3, a fourth additional conductive line 132-4) configured and positioned to carry power signals (e.g., $V_{cc}$ signals) to circuitry (e.g., metal-oxide-semiconductor field-effect transistor (MOSFET) inverters, such as complementary metal-oxide semiconductor (CMOS) inverters) of the timing delay stages 118. In addition, the timing delay and page buffer driver section 104 further includes conductive routing 134 (e.g., first conductive routing 134-1, second conductive routing 134-2, third conductive routing 134-3, fourth conductive routing 134-4) coupling output terminals of the timing delay stages 118 to input terminals of the page buffer drivers 122 and the inverters 130.

As depicted in FIG. 1B, in some embodiments, the first inverter 130-1 of the timing delay and page buffer driver section 104 is configured and positioned to receive a control signal at an input terminal thereof (e.g., by way of an input line coupled thereto), and has an output terminal coupled to an input terminal of circuitry (e.g., a CMOS inverter) of the first timing delay stage 118-1. An additional input terminal of circuitry (e.g., the CMOS inverter) of the first timing delay stage 118-1 may be coupled to the first additional conductive line 132-1, and an output terminal of circuitry of the first timing delay stage 118-1 may be coupled to an input terminal of the second inverter 130-2 and an input terminal of the first page buffer driver 122-1 by way of the first conductive routing 134-1. An output terminal of the first page buffer driver 122-1 may be coupled to the first conductive line 124-1. An output terminal of the second inverter 130-2 may be coupled to an input terminal of circuitry (e.g., a CMOS inverter) of the second timing delay stage 118-2. An additional input terminal of circuitry (e.g., the CMOS inverter) of the second timing delay stage 118-2 may also be coupled to the second additional conductive line 132-2, and an output terminal of the second timing delay stage 118-2 may be coupled to an input terminal of third inverter 130-3 and an input terminal of the second page buffer driver 122-2 by way of the second conductive routing 134-2. An output terminal of the second page buffer driver 122-2 may be coupled to the second conductive line 124-2. An output terminal of the third inverter 130-3 may be coupled to an input terminal of circuitry (e.g., a CMOS inverter) of the third timing delay stage 118-3. An additional input terminal of circuitry (e.g., the CMOS inverter) of the third timing delay stage 118-3 may also be coupled to the third additional conductive line 132-3, and an output terminal of the third timing delay stage 118-3 may be coupled to an input terminal of the fourth inverter 130-4 and an input terminal of a third page buffer driver 122-3 by way of the third conductive routing 134-3. An output terminal of the third page buffer driver 122-3 may be coupled to a third conductive line 124-3. An output terminal of the fourth inverter 130-4 may be coupled to an input terminal of circuitry (e.g., a CMOS inverter) of the fourth timing delay stage 118-4. An additional input terminal of circuitry (e.g., the CMOS inverter) of the fourth timing delay stage 118-4 may also be coupled to the fourth additional conductive line 132-4, and an output terminal of the fourth timing delay stage 118-4 may be coupled to an input terminal of a subsequent inverter 130 and an input terminal of a fourth page buffer driver 122-4 by way of the fourth conductive routing 134-4. An output terminal of the fourth page buffer driver 122-4 may be coupled to a fourth conductive line 124-4. Additional features (if any) of the timing delay and page buffer driver section 104 may follow in a similar manner.

Figure 1C:
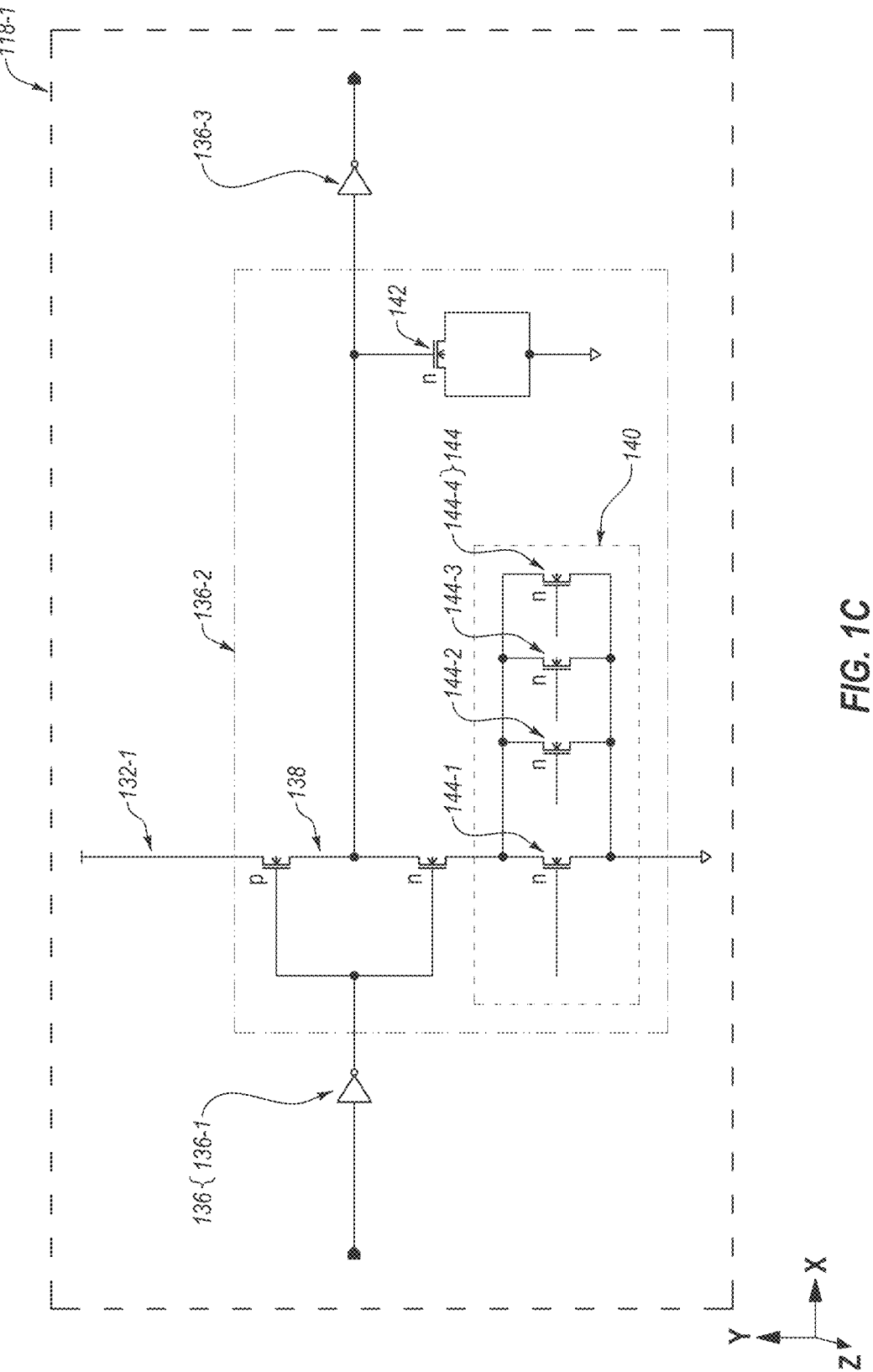
FIG. 1C is a schematic diagram of circuitry of a timing delay stage of the timing delay and page buffer driver section shown in FIG. 1B.

FIG. 1C is a schematic diagram of circuitry of the first timing delay stage 118-1 of the timing delay and page buffer driver section 104 shown in FIG. 1B, in accordance with embodiments of the disclosure. Additional timing delay stages 118 (e.g., the second timing delay stage 118-2 (FIG. 1B), the third timing delay stage 118-3 (FIG. 1B), the fourth timing delay stage 118-4 (FIG. 1B), and so on, through the final timing delay stage 118-N (FIG. 1A)) of the timing delay and page buffer driver section 104 (FIG. 1B) may exhibit configurations substantially similar to the configuration of the first timing delay stage 118-1 described below with reference to FIG. 1C.

As shown in FIG. 1C, the first timing delay stage 118-1 includes three (3) inversion sub-stages 136. The three (3) inversion sub-stages 136 may include a first inversion sub-stage 136-1, a second inversion sub-stage 136-2, and a third inversion sub-stage 136-3. The second inversion sub-stage 136-2 may be interposed between and coupled to the first inversion sub-stage 136-1 and the third inversion sub-stage 136-3. An input terminal of an inverting buffer of the first inversion sub-stage 136-1 may be coupled to an output terminal of the first inverter 130-1 (FIG. 1B), and an output terminal of the inverting buffer of the first inversion sub-stage 136-1 may be coupled to an input terminal of circuitry of the second inversion sub-stage 136-2. As described in further detail below, the second inversion sub-stage 136-2 may be configured and operated to trimmably (e.g., adjustably) delay propagation of a control signal received from the inverting buffer of the first inversion sub-stage 136-1. An input terminal of an additional inverting buffer of the third inversion sub-stage 136-3 may be coupled to an output terminal of circuitry of the second inversion sub-stage 136-2, and an output terminal of the additional inverting buffer of the third inversion sub-stage 136-3 may be coupled to input terminals of the first page buffer driver 122-1 (FIG. 1B) and the second inverter 130-2 (FIG. 1B).

As shown in FIG. 1C, the second inversion sub-stage 136-2 may include a CMOS inverter 138, a trimmable discharge circuit 140, and a capacitor 142. The trimmable discharge circuit 140 includes multiple (e.g., a plurality of) nMOSFETs 144 (e.g., a first nMOSFET 144-1, a second nMOSFET 144-2, a third nMOSFET 144-3, a fourth nMOS-FET 144-4) electrically connected in parallel. Each of the nMOSFETs 144 individually form a branch of the trimmable discharge circuit 140. A voltage input ($V_{in}$) terminal of the CMOS inverter 138 may be coupled to the output terminal of the inverting buffer of the first inversion sub-stage 136-1. An input terminal (e.g., source terminal) of the pMOSFET of the CMOS inverter 138 may be coupled to the first additional conductive line 132-1 (e.g., first $V_{cc}$ line). An input terminal (e.g., source terminal) of the nMOSFET of the CMOS inverter 138 may be coupled to output terminals (e.g., drain terminals) of the nMOSFETs 144 of the trimmable discharge circuit 140. Input terminals (source terminals) the nMOSFETs 144 of the trimmable discharge circuit 140 may be coupled to ground ($V_{ss}$). A voltage output ($V_{out}$) terminal of the CMOS inverter 138 may be coupled to the capacitor 142 and to the input terminal of the additional inverting buffer of the third inversion sub-stage 136-3. The combination of CMOS inverter 138, the trimmable discharge circuit 140, and the capacitor 142 of the second inversion sub-stage 136-2 effectively form a resistor-capacitor (RC) circuit that may be used to adjustably delay signal propagation through the second inversion sub-stage 136-2 (and, hence, the first timing delay stage 118-1) by controlling the current strength of a path for discharging the capacitor 142 by selective activation of individual nMOS-FET 144 of the trimmable discharge circuit 140.

In operation, when a control signal received by the $V_{in}$ terminal of the CMOS inverter 138 is logic LOW, the pMOSFET of the CMOS inverter 138 is turned ON and acts as a non-linear resistor, the nMOSFET of the CMOS inverter 138 is turned OFF, and the capacitor 142 charges (e.g., through $V_{cc}$) such that the control signal output from the second inversion sub-stage 136-2 is logic HIGH. Conversely, when a control signal received by the $V_{in}$ terminal of the CMOS inverter 138 is logic HIGH, the pMOSFET of the CMOS inverter 138 is turned OFF, the nMOSFET of the CMOS inverter 138 is turned ON, and the capacitor 142 discharges to ground ($V_{ss}$) to drive the control signal output from the second inversion sub-stage 136-2 to logic LOW. The quantity of nMOSFET 144 of the trimmable discharge circuit 140 that are turned ON during the discharge phase determines the current strength of the discharge path, and, hence, the delay (e.g., fall time) to reach logic LOW. Increasing a quantity of the nMOSFETs 144 of the trimmable discharge circuit 140 that are turned ON increases the current strength of the discharge path and reduces the delay to reach logic LOW. As a non-limit example, if only one (1) of the nMOSFETs 144 (e.g., the first nMOSFET 144-1) of the trimmable discharge circuit 140 is turned ON, the time to discharge the capacitor 142 (and, hence, the delay in the propagation of a logic LOW control signal to the third inversion sub-stage 136-3) may, in some instances, be about 20 nanoseconds (ns); but if four (4) of the nMOSFETs 144 (e.g., the first nMOSFET 144-1, the second nMOSFET 144-2, the third nMOSFET 144-3, the fourth nMOSFET 144-4) the time to discharge the capacitor 142 (and, hence, the delay in the propagation of a logic LOW control signal to the third inversion sub-stage 136-3) may, in some instances, be about 10 ns. Thus, the nMOSFETs 144 of the trimmable discharge circuit 140 may be selectively turned ON, as desired, to adjust (e.g., trim) the delay in propagating a control signal through the first timing delay stage 118-1 (FIG. 1B).

While in FIG. 1C, the trimmable discharge circuit 140 of the second inversion sub-stage 136-2 is depicted as including four (4) nMOSFETs 144, the disclosure is not so limited. Rather, the trimmable discharge circuit 140 may include less than four (4) nMOSFETs 144 (e.g., three (3) nMOSFETs 144, two (2) nMOSFETs 144), or may include more than four (4) nMOSFETs 144 (e.g., greater than or equal to six (6) nMOSFETs 144, greater than or equal to eight (8) nMOS-FETs 144, greater than or equal to ten (10) nMOSFETs 144), as desired.

With returned reference to FIG. 1B, by adjustably delaying signal propagation through each of the timing delay stages 118 in the manner described above (with reference to FIG. 1C) for the first timing delay stage 118-1, the page buffer drivers 122 may control different portions of the page buffer circuitry (e.g., different groups of page buffers) of the plane section 102 (FIG. 1A) at different times (e.g., staggered times) than one another. As a non-limiting example, if each of the timing delay stages 118 is individually configured and operated to delay signal propagation therethrough (e.g., by way of the second inversion sub-stage 136-2 (FIG. 1C) thereof) by at least 10 ns, each page buffer driver 122 may control the portion of the page buffer circuitry (e.g., the group of the page buffers) coupled thereto at least 10 ns later than an immediately preceding page buffer driver 122. For example, the second page buffer driver 122-2 may control a second portion of the page buffer circuitry (e.g., a second group of the page buffers) at least 10 ns later than the first page buffer driver 122-1 controls a first portion of the page buffer circuitry (e.g., a first group of the page buffers); the third page buffer driver 122-3 may control a third portion of page buffer circuitry (e.g., a third group of the page buffers) at least 10 ns later than the second page buffer driver 122-2 controls the second portion of the page buffer circuitry (e.g., the second group of the page buffers); the fourth page buffer driver 122-4 may control a fourth portion of the page buffer circuitry (e.g., a fourth group of the page buffers) at least 10 ns later than the third page buffer driver 122-3 controls the third portion of the page buffer circuitry (e.g., the third group of the page buffers); and so on, up to the final page buffer driver 122-N (FIG. 1A). The delays in signal propagation effectuated by the timing delay stages 118 may be adjusted (e.g., trimmed), as desired, based on application needs (as influenced by, for example, the performance impact of such delays and the peak power reduction desired).

Referring to FIG. 1A, by staggering control of different portions of the page buffer circuitry of the plane section 102 in time, risks that may otherwise be associated with a relatively high $V_{cc}$ drop or a relatively high $V_{ss}$ bounce effectuated by a single power request for controlling all of the page buffer circuitry (e.g., all of the page drivers) simultaneously may be mitigated. As a non-limiting example, as the I/O regions 110 of the plane section 102 are positioned relatively close to the page buffer circuitry (e.g., as at least partially defined by the sense amplifier regions 106 and the data cache regions 112) utilizing a common (e.g., the same) supply power, controlling all of the page buffer circuitry simultaneously while the data I/O path is running could effectuate a relatively high $V_{cc}$ drop or $V_{ss}$ bounce that could corrupt the I/O data. Such I/O data corruption could occur, for example, when executing a page buffer macro to read from a memory array while simultaneously performing data output for a previous read. By staggering control of different portions of the page buffer circuitry of the plane section 102 in time, $V_{cc}$ drop and $V_{ss}$ bounce may be kept within limits ensuring no I/O data corruption.

Thus, a microelectronic device in accordance with embodiments of the disclosure comprises a microelectronic device structure comprising a section comprising page buffers, and an additional section horizontally neighboring the section and comprising page buffer drivers and a timing delay chain coupled to the page buffer drivers. Each of the page buffer drivers is coupled to a different group of the page buffers than each other of the page buffer drivers. The timing delay chain comprises timing delay circuits coupled in series with one another. Each of the timing delay circuits is configured to adjustably delay propagation of a control signal therethrough.

In addition to controlling peak power requests associated with the function of the page buffer circuitry within an individual plane section 102 of the microelectronic device structure 100 by way of the configurations (e.g., hardware configurations) and operations described above with reference to FIGS. 1A through 1C, control of page buffer circuitry within the multiple, different plane sections 102 within the microelectronic device structure 100 may be performed asynchronously (e.g., staggered in time, sequentially) to reduce an overall peak power request for operating all of the page buffer circuitry of the multiple, different plane sections 102 relative to synchronous operation of all of the page buffer circuitry of the multiple, different plane sections 102. Such control may be facilitated by a firmware approach that includes serializing a page buffer elaboration phase by different plane sections 102 and/or by different groups of plane sections 102. A control register that is independent of any particular plane section 102 may, for example, be used to inhibit operation of the page buffer circuitry of at least one of the different plane sections 102 during operation of the page buffer circuitry of at least one other of the different plane sections 102. To illustrate, reference is made below to FIG. 2, which is simplified, partial plan view of a microelectronic device structure 200 for a microelectronic device (e.g., a semiconductor device; a memory device, such as a 3D NAND Flash memory device), in accordance with embodiments of the disclosure.

Figure 2:
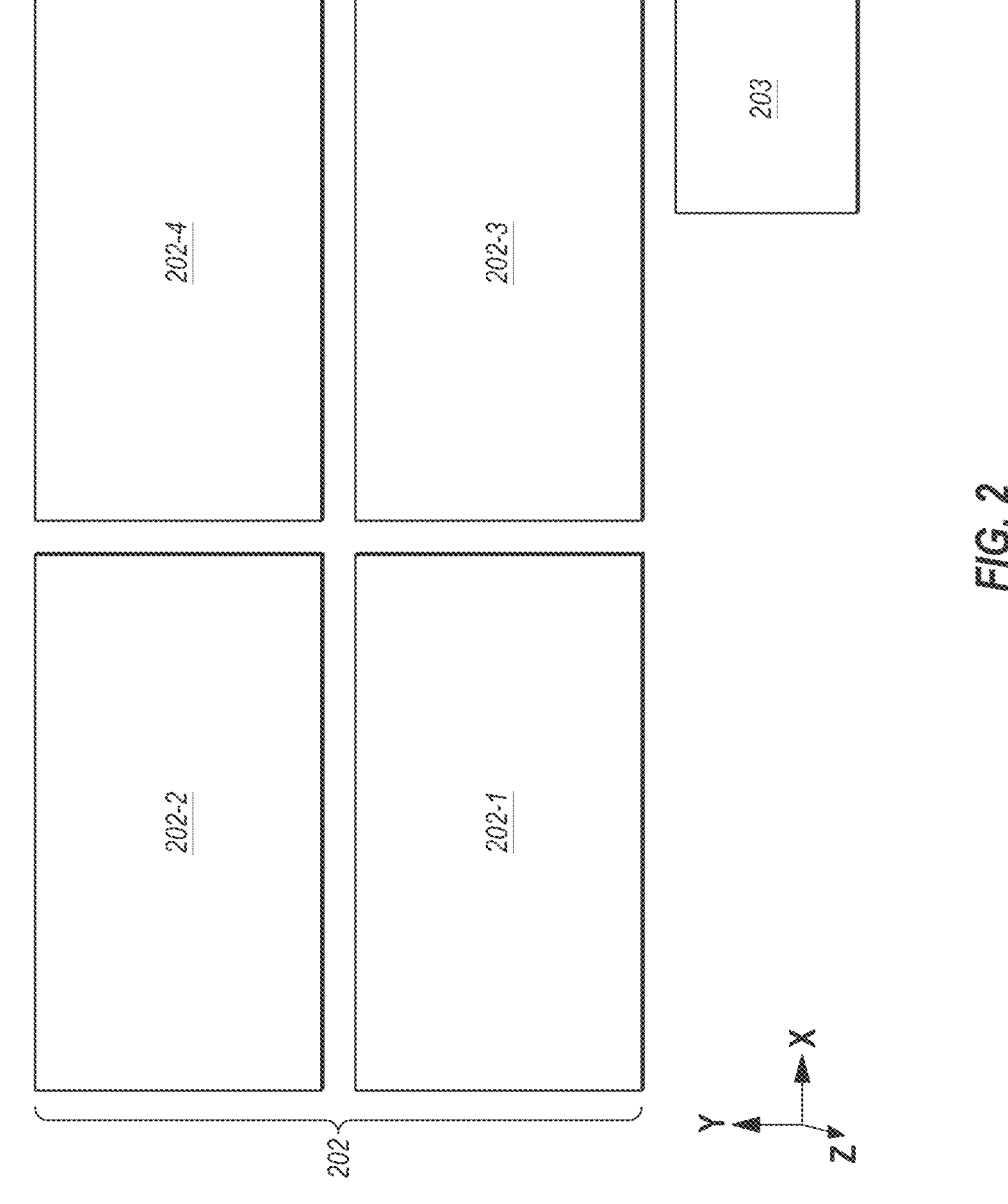
FIG. 2 is a simplified, partial plan view of a microelectronic device structure of a microelectronic device, in accordance with additional embodiments of the disclosure.

Referring to FIG. 2, the microelectronic device structure 200 may include multiple (e.g., a plurality of) plane sections 202. By way of non-limiting example, the multiple plane sections 202 may include four (4) plane sections 202, such as a first plane section 202-1, a second plane section 202-2, a third plane section 202-3, and a fourth plane section 202-4. The second plane section 202-2 may horizontally neighbor the first plane section 202-1 in the Y-direction, and may be substantially horizontally aligned with the first plane section 202-1 in the X-direction. The third plane section 202-3 may horizontally neighbor the first plane section 202-1 in the X-direction, and may be substantially horizontally aligned with the first plane section 202-1 in the Y-direction. The fourth plane section 202-4 may horizontally neighbor the third plane section 202-3 in the Y-direction and the second plane section 202-2 in the X-direction. The fourth plane section 202-4 may be substantially horizontally aligned with the third plane section 202-3 in the X-direction, and may be substantially horizontally aligned with the second plane section 202-2 in the Y-direction. The fourth plane section 202-4 may be positioned diagonally opposite (e.g., kitty-corner) the first plane section 202-1, and the second plane section 202-2 may be positioned diagonally opposite (e.g., kitty-corner) the third plane section 202-3. In additional embodiments, the microelectronic device structure 200 includes a different quantity (e.g., less than (4); greater than (4) four, such as greater than or equal to six (6), greater than or equal to eight (8), greater than or equal to sixteen (16)) and/or a different arrangement of plane sections 202. Each of the plane sections 202 of the microelectronic device structure 200 may individually have a configuration (e.g., a hardware configuration) substantially similar to that of the plane section 102 previously described herein with reference to FIG. 1A.

The microelectronic device structure 200 may further include timing delay and page buffer driver sections operatively associated with each of the plane sections 202. The timing delay and page buffer driver sections of the microelectronic device structure 200 may each exhibit a configuration (e.g., a hardware configuration) substantially similar to that of the timing delay and page buffer driver section 104 previously described herein with reference to FIGS. 1A through 1C. Each timing delay and page buffer driver section of the microelectronic device structure 200 may be configured and operated to stagger control and operation of different portions of page buffer circuitry (e.g., different groups of page buffers) within an individual plane section 202 in time to facilitate a reduction in peak power requirements associated with page buffer macro execution relative to conventional configurations.

As shown in FIG. 2, the microelectronic device structure 200 may further include a $V_{cc}$ regulator 203 configured and operated to regulate up or down $V_{cc}$ received from a $V_{cc}$ source. The $V_{cc}$ regulator 203 may be positioned at a desired location (e.g., a desired peripheral location) within a horizontal area of the microelectronic device structure 200, and may be located relatively horizontally closer (e.g., proximate) at least one of the plane sections 202 than at least one other of the plane sections 202. By way of non-limiting example, as depicted in FIG. 2, the $V_{cc}$ regulator 203 may be located horizontally closer to the third plane section 202-3 than each of the first plane section 202-1, the second plane section 202-2, and the fourth plane section 202-4. In additional embodiments, the $V_{cc}$ regulator 203 may be positioned at a different horizontal location within the microelectronic device structure 200, such as a horizontal location relatively more horizontally distal from the third plane section 202-3 and relatively horizontally closer to one or more other of the plane sections 202.

With continued reference to FIG. 2, firmware of the microelectronic device structure 200 may be configured to serialize (e.g., split) a page buffer elaboration phase (also referred to herein as a "critical macro phase") within a full page buffer macro execution, such that control of the page buffer circuitry (e.g., page buffers) of one or more of the plane section(s) 202 is staggered in time relative to control of the page buffer circuitry (e.g., page buffers) of one or more other of the plane section(s) 202. The page buffer elaboration phase within the full page buffer macro execution may be responsible for executing the asynchronous control of different portions of the page buffer circuitry (e.g., different groups of the page buffers) within an individual plane section previously described herein with reference to FIGS. 1A through 1C. A control register independent of each of the plane sections 202 is employed to provide the firmware the flexibility to stagger selection and control of the page buffer circuitry of the different plane section(s) 202 in time within the page buffer elaboration phase. A control signal for control of the page buffer circuitry of the microelectronic device structure 200 may be delayed in time for one or more of the plane section(s) 202 relative to one or more of the plane section(s) 202.

Figure 3:
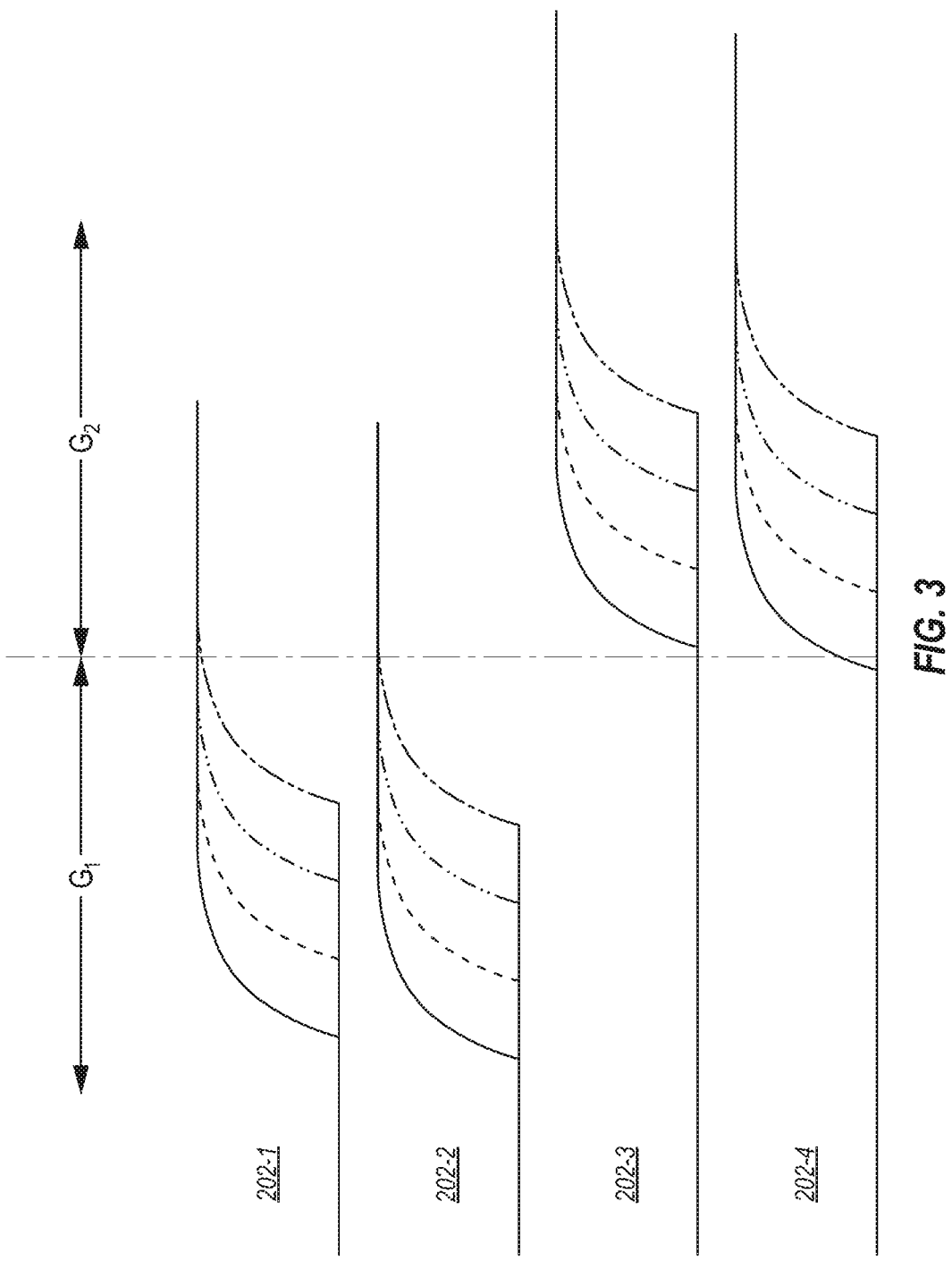
FIG. 3 is a control signal timing diagram for a page buffer elaboration phase of a page buffer macro executed in accordance with embodiments of the disclosure.

As a non-limiting example, during the page buffer elaboration phase, control of the page buffer circuitry (e.g., page buffers) of the first plane section 202-1 and the second plane section 202-2 may be staggered in time relative to control of the page buffer circuitry (e.g., page buffers) of the third plane section 202-3 and the fourth plane section 202-4. FIG. 3 depicts a control signal timing diagram for such a page buffer elaboration phase within a full page buffer macro execution. As shown in FIG. 3, control of the page buffer circuitry of the first plane section 202-1 and the second plane section 202-2 may be effectuated within a first time period $G_1$ of the page buffer elaboration phase; and the control of the page buffer circuitry of the third plane section 202-3 and the fourth plane section 202-4 may be effectuated within a second time period $G_2$ of the page buffer elaboration phase that is staggered (e.g., temporally offset) from the first time period $G_1$. Control operations for the page buffer circuitry of the first plane section 202-1 may be effectuated concurrently with control operations for the page buffer circuitry of the second plane section 202-2 within the first time period $G_1$; and control operations for the page buffer circuitry of the third plane section 202-3 may be effectuated concurrently with control operations for the page buffer circuitry of the fourth plane section 202-4 within the second time period $G_2$. As depicted in FIG. 3, for each plane section 202 (e.g., the first plane section 202-1, the second plane section 202-2, the third plane section 202-3, and the fourth plane section 202-4), control signals for controlling different portions of the page buffer circuitry (e.g., each portion operatively associated with a different page buffer driver) within the plane section 202 may be staggered in time relative to one another through the configurations (e.g., hardware configurations) and operations previously described herein with reference to FIGS. 1A through 1C.

In additional embodiments, different plane sections 202 may be grouped together for concurrent page buffer control operations with one another during the page buffer elaboration phase. By way of non-limiting example, plane sections 202 horizontally neighboring one another in the X-direction and horizontally aligned within one another in the Y-direction (e.g., the first plane section 202-1 and the third plane section 202-3; the second plane section 202-2 and the fourth plane section 202-4) may be grouped together; or plane sections 202 diagonally opposing one another (e.g., the first plane section 202-1 and the fourth plane section 202-4; the second plane section 202-2 and the third plane section 202-3) may be grouped together. Control of the page buffer circuitry of the different groups of the plane sections 202 may be staggered in time within the page buffer elaboration phase in a manner similar to that described above with reference to FIG. 3. Depending, at least in part, on the horizontal position of the $V_{cc}$ regulator 203 within the microelectronic device structure 200, different groupings of the plane section 202 may effectuate different reductions in a peak power request during the page buffer elaboration phase than one another. In some embodiments, groups individually including diagonally opposing plane sections 202 result in the relatively greatest reduction of peak power request due, at least in part, to a horizontal position of the $V_{cc}$ regulator 203 proximate at least one of the plane sections 202 of each of the groups.

Figure 4:
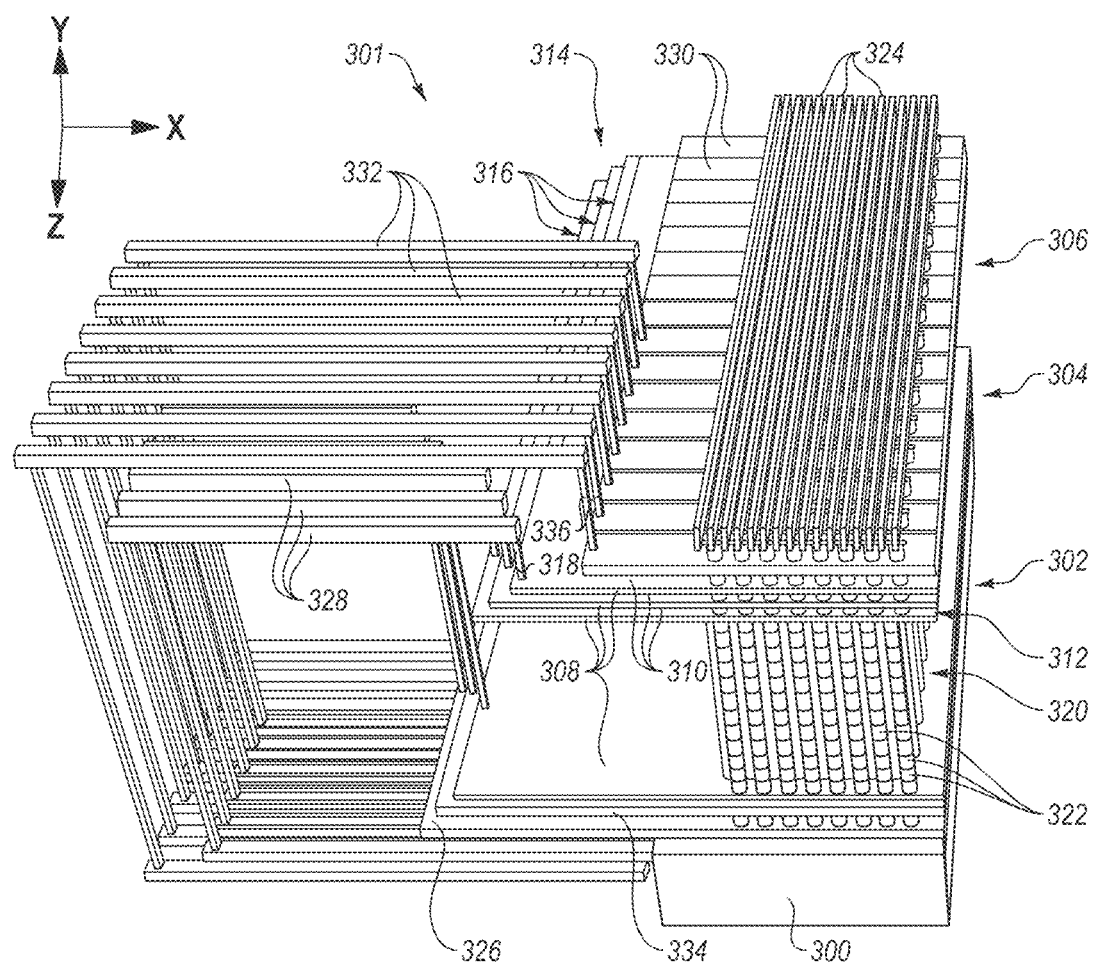
FIG. 4 is a simplified partial cutaway perspective view of a microelectronic device, in accordance with embodiments of the disclosure.

Microelectronic device structures (e.g., the microelectronic device structures 100, 200) of the disclosure may be included in microelectronic devices of the disclosure. For example, FIG. 4 illustrates a partial cutaway perspective view of a portion of a microelectronic device 301 (e.g., a memory device, such as a 3D NAND Flash memory device) including a microelectronic device structure 300. The microelectronic device structure 300 may be substantially similar to a microelectronic device structure (e.g., the microelectronic device structure 100, the microelectronic device structure 200) previously described herein. The microelectronic device structure 300 may, for example, include at least one plane section 302, and at least one timing delay and page buffer driver section 304 operatively associated within the at least one plane section 302. The plane section 302 and the timing delay and page buffer driver section 304 may respectively be substantially similar to the plane section 102 and the timing delay and page buffer driver section 104 of the microelectronic device structure 100 previously described herein with reference to FIGS. 1A through 1C.

In addition to the plane section 302 and the timing delay and page buffer driver section 304, the microelectronic device structure 300 may include additional regions including logic devices configured to control various operations of components of the microelectronic device 301. As a non-limiting example, the microelectronic device structure 300 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drivers (e.g., string drivers), decoders (e.g., local deck decoders, column decoders, row decoders), additional sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), additional I/O devices (e.g., local I/O devices), memory test devices, MUX, error checking and correction (ECC) devices, self-refresh/wear leveling devices, and other chip/deck control circuitry.

The microelectronic device 301 may further include a stack structure 306 overlying the microelectronic device structure 300 and including a vertically alternating (e.g., in the Z-direction) sequence of conductive structures 308 and insulative structures 310 arranged in tiers 312; a staircase structure 314 having steps 316 defined by edges (e.g., horizontal ends in the X-direction) of the tiers 312; access line contact structures 318 contacting (e.g., physically contacting, electrically contacting) the conductive structures 308 of the tiers 312 of the stack structure 306 at the steps 316 of the staircase structure 314; strings 320 of memory cells 322 coupled to each other in series and extending through the stack structure 306; data lines 324 (e.g., bit lines, digit lines) overlying the stack structure 306 and coupled to the strings 320 of memory cells 322; a source structure 326 (e.g., a source plate) underlying the stack structure 306 and coupled to the strings 320 of memory cells 322; access line routing structures 328 coupled to the access line contact structures 318; first select gates 330 (e.g., upper select gates, drain select gates (SGDs)) between the stack structure 306 and the data lines 324, and coupled to the strings 320 of memory cells 322; select line routing structures 332; second select gates 334 (e.g., lower select gates, source select gate (SGSs)) between the stack structure 306 and the source structure 326, and coupled to the strings 320 of memory cells 322; and select line contact structures 336 coupled to the select line routing structures 332 and the first select gates 330. Various circuitry (e.g., logic circuitry) within the microelectronic device structure 300 may be coupled to the source structure 326, the access line routing structures 328, the select line routing structures 332, and the data lines 324.

As shown in FIG. 4, the strings 320 of memory cells 322 of the microelectronic device 301 may extend vertically and orthogonal to conductive lines and tiers (e.g., the data lines 324, the source structure 326, the tiers 312 of the stack structure 306, the access line routing structures 328, the first select gates 330, the select line routing structures 332, the second select gates 334) of the microelectronic device 301. In some embodiments, the memory cells 322 comprise so-called "MONOS" (metal—oxide—nitride—oxide— semiconductor) memory cells. In additional embodiments, the memory cells 322 comprise so-called "TANOS" (tantalum nitride—aluminum oxide—nitride—oxide—semiconductor) memory cells, or so-called "BETANOS" (band/barrier engineered TANOS) memory cells, each of which are subsets of MONOS memory cells. In further embodiments, the memory cells 322 comprise so-called "floating gate" memory cells.

Thus, a memory device in accordance with embodiments of the disclosure comprises a memory array comprising vertically extending strings of memory cells, and a base structure underlying the memory array and including logic circuitry in electrical communication with the memory array. The base structure comprises a first section, a second section, and conductive lines. The first section comprises sense regions, data cache regions, input/output regions, and data line exit regions. The sense regions comprise sense amplifiers. The data cache regions horizontally neighbor the sense regions and comprise data latches. The data latches of the data cache regions are coupled to the sense amplifiers of the sense regions to form page buffer circuits. The input/output regions comprise input/output circuitry coupled to the page buffer circuits. Each of the input/output regions are horizontally interposed between two of the data cache regions. The data line exit regions horizontally neighbor the sense regions and comprise conductive structures coupling at least a portion of the memory array to the page buffer circuits. The second section horizontally neighbors the first section and comprises page buffer drivers, and a timing delay relay coupled to the page buffer drivers. The timing delay relay comprises timing delay circuits coupled in series with one another. Each of the timing delay circuits is configured to adjustably delay propagation of a control signal through a subsequent portion of the timing delay chain such that the control signal is asynchronously received by each of the page buffer drivers relative to each other of the page buffer drivers. The conductive lines are coupled to the page buffer drivers and horizontally extend through the first section. The conductive lines couple each of the page buffer drivers to a different group of the page buffer circuits than each other of the page buffer drivers.

Furthermore, in accordance with embodiments of the disclosure, a method of operating a memory device comprises delaying propagation of a control signal to different page buffer drivers coupled to different groups of page buffers operatively associated with at least one plane of memory cells to stagger control of the different groups of page buffers in time.

Figure 5:
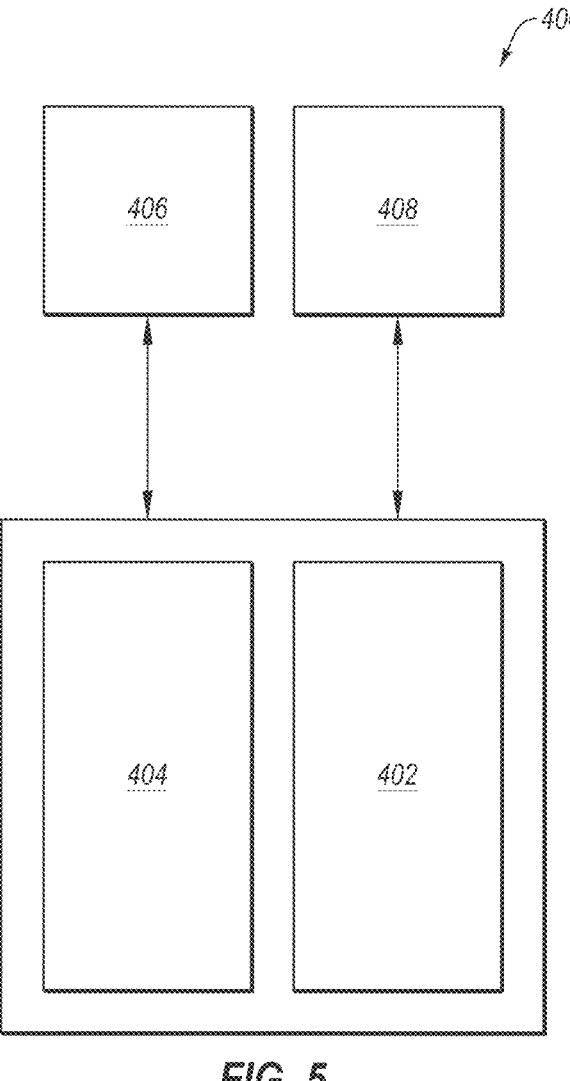
FIG. 5 is a schematic block diagram illustrating an electronic system, in accordance with embodiments of the disclosure.

Microelectronic device structures (e.g., the microelectronic device structures 100, 200) and microelectronic devices (e.g., the microelectronic device 301) in accordance with embodiments of the disclosure may be used in embodiments of electronic systems of the disclosure. For example, FIG. 5 is a block diagram of an illustrative electronic system 400 according to embodiments of the disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure (e.g., the microelectronic device structure 100, the microelectronic device structure 200) and a microelectronic device (e.g., the microelectronic device 301) previously described herein. The electronic system 400 may further include at least one electronic signal processor device 404 (often referred to as a "microprocessor"). The electronic signal processor device 404 may, optionally, include an embodiment of one or more of a microelectronic device structure (e.g., the microelectronic device structure 100, the microelectronic device structure 200) and a microelectronic device (e.g., the microelectronic device 301) previously described herein. While the memory device 402 and the electronic signal processor device 404 are depicted as two (2) separate devices in FIG. 5, in additional embodiments, a single (e.g., only one)

memory/processor device having the functionalities of the memory device 402 and the electronic signal processor device 404 is included in the electronic system 400. In such embodiments, the memory/processor device may include one or more of a microelectronic device structure (e.g., the microelectronic device structure 100, the microelectronic device structure 200) and a microelectronic device (e.g., the microelectronic device 301) previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, one or more of a monitor, a display, a printer, an audio output jack, and a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, an electronic system in accordance with embodiments of the disclosure comprises an input device, an output device, a processor device operably coupled to the input device and the output device, and a memory device operably coupled to the processor device. The memory device comprises a memory array, and a base structure underlying the memory array. The base structure comprises a buffer section, and a timing delay and page buffer driver section horizontally neighboring the buffer section. The buffer section comprises page buffer circuitry operatively associated with the memory array. The timing delay and page buffer driver section comprises page buffer drivers, and a timing delay chain coupled to the page buffer drivers. Each of the page buffer drivers is coupled to different portions of the page buffer circuitry than each other of the page buffer drivers. The timing delay chain comprises a series of timing delay circuits. At least some of the timing delay circuits are individually configured to adjustably delay propagation of a control signal to at least one of the page buffer drivers and to a subsequent portion of the timing delay chain.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents. For example, elements and features disclosed in relation to one or more embodiments of the disclosure may be combined with elements and features disclosed in relation to one or more other embodiments of the disclosure.

What is claimed is:

1. A method of operating a memory device, comprising delaying propagation of a control signal to different page buffer drivers coupled to different groups of page buffers operatively associated with at least one plane of memory cells to stagger control of the different groups of page buffers in time, delaying propagation of the control signal including adjustably delaying propagation of the control signal through a series of timing delay stages coupled to the different page buffer drivers, each of the timing delay stages coupled in series with one another and individually configured to adjustably delay propagation of the control signal to a respective one of the different page buffer drivers.

2. The method of claim 1, wherein:

the different groups of page buffers are confined within one plane section of a base structure, the one plane section of the base structure operatively associated with only one plane of the memory cells; and delaying propagation of the control signal to the different page buffer drivers comprises asynchronously controlling the different groups of page buffers confined within the one plane section of the base structure.

3. The method of claim 1, wherein:

at least some of the different groups of page buffers are confined within different plane sections of a base structure than one another, the different plane sections of the base structure operatively associated with different planes of the memory cells than one another; and delaying propagation of the control signal to the different page buffer drivers comprises asynchronously controlling first groups of page buffers within at least one of the different plane sections relative to second groups of page buffers within at least one other of the different plane sections.

4. The method of claim 3, wherein asynchronously controlling first groups of page buffers within at least one of the different plane sections relative to second groups of page buffers within at least one other of the different plane sections comprises:

simultaneously controlling two or more of the first groups of page buffers within two or more of the different plane sections, each of the two or more of the first groups of page buffers within a different one of the two or more of the different plane sections than each other of the two or more of the first groups of page buffers; and simultaneously controlling two or more of the second groups of page buffers within two or more other of the different plane sections, each of the two or more of the second groups of page buffers within a different one of the two or more other of the different plane sections than each other of the two or more of the second groups of page buffers.

5. The method of claim 1, wherein adjustably delaying propagation of the control signal through the series of timing delay stages comprises staggering transitions in logic levels of the control signal by way of the series of timing delay stages to delay propagation of the control signal to page buffer drivers positioned progressively farther along the series of timing delay stages relative to preceding page buffer drivers.

6. The method of claim 1, wherein each of the timing delay stages comprises a trimmable discharge circuit configured to adjust a delay in propagating the control signal therethrough.

7. The method of claim 6, wherein the trimmable discharge circuit comprises a plurality of nMOSFETs electrically connected in parallel, and wherein adjustably delaying propagation of the control signal comprises selectively activating individual ones of the nMOSFETs to control a current strength of a discharge path.

8. The method of claim 7, wherein increasing a quantity of the nMOSFETs that are activated increases the current strength of the discharge path and reduces the delay in propagating the control signal through a respective one of the timing delay stages.

9. The method of claim 6, wherein each of the timing delay stages further comprises:

a first inversion sub-stage comprising a first inverting buffer;

a second inversion sub-stage comprising a CMOS inverter, the trimmable discharge circuit, and a capacitor, a voltage input terminal of the CMOS inverter coupled to an output terminal of the first inverting buffer, a source terminal of a pMOSFET of the CMOS inverter coupled to a supply voltage line, the trimmable discharge circuit coupled to a source terminal of an nMOSFET of the CMOS inverter and to ground, and the capacitor coupled to a voltage output terminal of the CMOS inverter; and a third inversion sub-stage comprising a second inverting buffer having an input terminal coupled to the voltage output terminal of the CMOS inverter.

10. The method of claim 1, further comprising propagating the control signal through inverters interposed between and in series with the timing delay stages.

11. The method of claim 10, wherein an output terminal of each of the timing delay stages is coupled to an input terminal of one of the inverters and an input terminal of a respective one of the different page buffer drivers, and an output terminal of each of the inverters is coupled to an input terminal of a subsequent one of the timing delay stages.

12. The method of claim 1, wherein each of the different page buffer drivers drives a respective one of the different groups of page buffers by way of a conductive line extending through a plane section of the base structure comprising the different groups of page buffers.

13. The method of claim 1, wherein adjustably delaying propagation of the control signal through each of the timing delay stages comprises delaying propagation of the control signal by at least 10 nanoseconds per timing delay stage.

14. The method of claim 1, wherein a quantity of the timing delay stages equals a quantity of the different page buffer drivers.

15. A method of operating a memory device, comprising:
receiving a control signal at a timing delay chain comprising a series of timing delay circuits coupled in series with one another, each of the timing delay circuits configured to adjustably delay propagation of the control signal therethrough;

propagating the control signal through the series of timing delay circuits to asynchronously deliver the control signal to different page buffer drivers coupled to different groups of page buffers; and driving, by each of the different page buffer drivers responsive to receiving the control signal, a respective one of the different groups of page buffers by way of conductive lines extending through a plane section of a base structure of the memory device.

16. The method of claim 15, wherein propagating the control signal through the series of timing delay circuits comprises adjusting a delay of each of the timing delay circuits by selectively activating nMOSFETs of a trimmable discharge circuit within each of the timing delay circuits.

17. The method of claim 15, wherein the different groups of page buffers each comprise sense amplifiers within sense amplifier sub-regions of a plane section, each of the conductive lines coupling one of the different page buffer drivers to the sense amplifiers within two or more of the sense amplifier sub-regions located within different sense amplifier regions of the plane section.

18. The method of claim 15, further comprising serializing a page buffer elaboration phase across different plane sections of the base structure, control of page buffers within at least one of the different plane sections staggered in time relative to control of page buffers within at least one other of the different plane sections.

19. A method of operating a memory device, comprising:
adjustably delaying propagation of a control signal through each of a series of timing delay stages to stagger delivery of the control signal to different page buffer drivers, each of the timing delay stages comprising a trimmable discharge circuit comprising a plurality of nMOSFETs electrically connected in parallel, selective activation of individual ones of the nMOSFETs adjusting a delay of a respective timing delay stage; and asynchronously driving, by the different page buffer drivers responsive to the staggered delivery of the control signal, different groups of page buffers operatively associated with at least one plane of memory cells of the memory device.

20. The method of claim 19, wherein each of the timing delay stages further comprises a CMOS inverter and a capacitor, and wherein the trimmable discharge circuit is coupled between a source terminal of an nMOSFET of the CMOS inverter and ground, the capacitor coupled to a voltage output terminal of the CMOS inverter, a current strength of a discharge path for discharging the capacitor determined by a quantity of the nMOSFETs of the trimmable discharge circuit that are activated.

* * * * *